(12) United States Patent
Sunohara et al.

(10) Patent No.: US 7,754,983 B2
(45) Date of Patent: Jul. 13, 2010

(54) ELECTRONIC PARTS PACKAGING STRUCTURE AND METHOD OF MANUFACTURING THE SAME

(75) Inventors: Masahiro Sunohara, Nagano (JP); Mitsutoshi Higashi, Nagano (JP)

(73) Assignee: Shinko Electric Industries Co., Ltd., Naganoken (JP)

( * ) Notice: Subject to any disclaimer, the term of this patent is extended or adjusted under 35 U.S.C. 154(b) by 102 days.

(21) Appl. No.: 11/407,934

(22) Filed: Apr. 21, 2006

(65) Prior Publication Data

US 2006/0246630 A1 Nov. 2, 2006

(30) Foreign Application Priority Data

Apr. 27, 2005 (JP) ............... 2005-129089

(51) Int. Cl.
*H01R 13/502* (2006.01)
*H01L 23/02* (2006.01)
*H05K 5/06* (2006.01)
(52) U.S. Cl. .................. 174/563; 174/564; 257/704
(58) Field of Classification Search .......... 174/520, 174/564, 563; 257/704; 361/730
See application file for complete search history.

(56) References Cited

U.S. PATENT DOCUMENTS 5,311,402 A * 5/1994 Kobayashi et al. ......... 361/760

| | | | | |
|---|---|---|---|---|
| 6,107,680 A | * | 8/2000 | Hodges | ........................ 257/680 |
| 6,928,728 B2 | * | 8/2005 | Walding et al. | ............... 29/858 |
| 2005/0012169 A1 | | 1/2005 | Ikeda et al. | |
| 2005/0167795 A1 | | 8/2005 | Higashi | |

FOREIGN PATENT DOCUMENTS

| JP | 06-53340 | * | 2/1994 |
|---|---|---|---|
| JP | 8-316496 | | 11/1996 |
| JP | 2004-209585 | | 7/2004 |
| JP | 2005-19966 | | 1/2005 |

* cited by examiner

*Primary Examiner*—Hung V Ngo
(74) *Attorney, Agent, or Firm*—Edwards Angell Palmer & Dodge LLP

(57) ABSTRACT

A method of manufacturing an electronic parts packaging structure, including the steps of preparing an electronic parts forming substrate in which an MEMS element is formed in a formation region and a concave portion is provided in a periphery part of the formation region, and a sealing cap in which a ring-shaped protruded bonding portion is provided in a part corresponding to the concave portion of the electronic parts forming substrate and a cavity is formed in a part corresponding to the formation region; and fitting the protruded bonding portion of the sealing cap into the concave portion of the electronic parts forming substrate. Thus, the MEMS element is hermetically sealed in the cavity of the sealing cap.

8 Claims, 11 Drawing Sheets

ELECTRONIC PARTS PACKAGING STRUCTURE AND METHOD OF MANUFACTURING THE SAME

CROSS-REFERENCE TO RELATED APPLICATIONS

This application is based on and claims priority of Japanese Patent Application No. 2005-129089 filed on Apr. 27, 2005, the entire contents of which are incorporated herein by reference.

BACKGROUND OF THE INVENTION

1. Field of the Invention

The present invention relates to an electronic parts packaging structure and a manufacturing method thereof. More particularly, the present invention relates to an electronic parts packaging structure in which an MEMS element and the like are formed while being hermetically sealed with a sealing cap, and a manufacturing method thereof.

2. Description of the Related Art

In the prior art, there is an MEMS (micro-electro-mechanical system) element device having a structure in which an MEMS element is formed on a substrate and is hermetically sealed with a sealing cap. As shown in FIG. 1, in an example of an element substrate of the MEMS element device in the prior art, a coil 102 and a protective layer 104 which covers the coil 102 are formed on a silicon substrate 100. Moreover, a switch element 106 having a movable portion 106a as an MEMS element is an provided on the protective layer 104. An electrode 108 is provided on the protective layer 104 corresponding to one end of the movable portion 106a of the switch element 106. Accordingly, when the movable portion 106a of the switch element 106 comes into contact with the electrode 108, a switch circuit is turned on.

Moreover, an opening 104a is provided in a portion of the protective layer 104 on a periphery part of the silicon substrate 100, and in the opening 104a, the silicon substrate 100 is exposed. Moreover, alignment marks M1 for positioning and disposing a sealing cap to be described later are formed on a peripheral side on the protective layer 104.

Furthermore, as shown in FIG. 2, a sealing cap 110 for hermetically sealing the switch element 106 is prepared, which is made of glass and has a cavity 110a provided in a center portion thereof. The sealing cap 110 also has alignment marks M2 provided in a periphery part of a bottom of the cavity 110a. Specifically, the alignment marks M2 are for disposing the sealing cap 110 to the switch element 106 with alignment condition.

As shown in FIGS. 3 and 4, a peripheral part of the sealing cap 110 is bonded to the peripheral part of the silicon substrate 100 in a state where the cap and the substrate are positioned so as to align and house the switch element 106 in the cavity 110a of the sealing cap 110 by use of an anodic bonding apparatus. In this event, the anodic bonding apparatus includes a recognition camera, and the positioning is performed based on recognition of the alignment marks M1 of the silicon substrate 100 and the alignment marks M2 of the sealing cap 110 by the recognition camera. Thus, the sealing cap 110 is disposed on the silicon substrate 100 and bonded thereto.

As a technology related to a method of manufacturing the MEMS element device as described above, the following technology is described in Patent Document 1 (Japanese Unexamined Patent Publication No. 2005-19966). Specifically, a cap arrayed wafer including a plurality of sealing caps is stuck to a semiconductor wafer having a plurality of MEMS elements provided thereon, thereby MEMS elements are sealed. And then, the wafer is cut to obtain individual packages.

Moreover, the following technology is described in Patent Document 2 (Japanese Unexamined Patent Publication No. Hei 8 (1996)-316496). Specifically, on a silicon wafer having a plurality of function elements provided thereon, another silicon wafer which has a cut formed therein in a state of being stuck to an adhesive sheet, is stuck by a bonding member. Thereby, the function element portion is sealed so as to be surrounded by the bonding member. And then the cut portion is removed and the silicon wafer of the function element side is cut.

Furthermore, the following technology is described in Patent Document 3 (Japanese Unexamined Patent Publication No. 2004-209585). Specifically, a case is bonded to a device main body in which a MEMS element is provided so as to define a hermetically-sealed space by use of ultrasonic bonding.

However, in the above-described method in which the sealing cap 110 is disposed on the silicon substrate 100 on which the MEMS element 106 is formed while aligning the cap with the substrate by use of the recognition camera, a complex and expensive alignment mechanism is required, which includes the recognition camera, software for processing images taken by the camera, and the like. Thus, there is a problem of an increase in manufacturing costs.

Furthermore, in the prior art, it is required to specially form the alignment marks on the silicon substrate 100 and the sealing cap 110. Particularly, in order to form the alignment marks M2 on the sealing cap 110 side, it is required to specially carry out deposition and photolithography. From this viewpoint, also manufacturing costs are increased.

SUMMARY OF THE INVENTION

It is an object of the present invention to provide an electronic parts packaging structure capable of hermetically sealing a MEMS element and the like by disposing a sealing cap in a state of being positioned on a substrate without using a complex alignment mechanism, and a manufacturing method thereof.

An electronic parts packaging structure according to the present invention includes, an electronic parts forming substrate in which an electronic parts is formed in a formation region and a concave portion is provided in a periphery part of the formation region; and a sealing cap in which a ring-shaped protruded bonding portion is formed and a cavity is provided by the protruded bonding portion, and the protruded bonding portion is fitted into and bonded to the concave portion in the electronic parts forming substrate, wherein the electronic parts is hermetically sealed in the cavity of the sealing cap.

Moreover, a method of manufacturing an electronic parts packaging structure according to the present invention includes steps of, preparing an electronic parts forming substrate in which an electronic parts is formed in a formation region and a concave portion is provided in a periphery part of the formation region, and a sealing cap in which a ring-shaped protruded bonding portion is formed at a portion corresponding to the concave portion in the electronic parts forming substrate and a cavity is provided in a portion corresponding to the formation region, and hermetically sealing the electronic parts in the cavity of the sealing cap by aligning and bonding the protruded bonding portion of the sealing cap into the concave portion of the electronic parts forming substrate by means of fitting the protruded bonding portions into the concave portion.

According to the present invention, the concave portion is formed in the periphery part of the formation region of the electronic parts forming substrate on which the electronic parts (such as a MEMS element) is formed in the formation region. The concave portion functions as a groove for alignment when the sealing cap is positioned and disposed on the electronic parts forming substrate. Thereafter, the sealing cap is prepared, in which the protruded bonding portion is formed in the part corresponding to the concave portion in the electronic parts forming substrate and the cavity is provided in the part corresponding to the formation region. Subsequently, the protruded bonding portion of the sealing cap is fitted into and bonded to the concave portion of the electronic parts forming substrate in a self-aligning manner. In the case where one of the electronic parts forming substrate and the sealing cap is made of silicon and the other is made of glass, the both can be easily bonded to each other by anodic bonding.

By adopting the method as described above, it is possible to hermetically seal the electronic parts by bonding the sealing cap to the electronic parts forming substrate in a state of aligning both with very easy method without using an apparatus having a complex alignment mechanism such as the prior art. Moreover, it is not required to specially form the alignment marks used in the prior art on the electronic parts forming substrate or on the sealing cap. Therefore, manufacturing costs can be significantly reduced compared with the prior art.

As described above, according to the present invention, it is possible to hermetically seal the electronic parts by bonding the sealing cap to the electronic parts forming substrate in a state of aligning the cap with the substrate at low cost.

DESCRIPTION OF THE EMBODIMENTS

Embodiments of the present invention will be explained with reference to the accompanying drawings hereinafter.

First Embodiment

FIGS. 5A to 5H are sectional views showing a method of manufacturing an electronic parts packaging structure according to a first embodiment of the present invention. FIG. 6 is a sectional view also showing the electronic parts packaging structure. In this embodiment, description will be given by taking, as an example, a MEMS element device having a structure in which a MEMS element as an electronic parts is formed on a substrate while being hermetically sealed.

Figure 1:
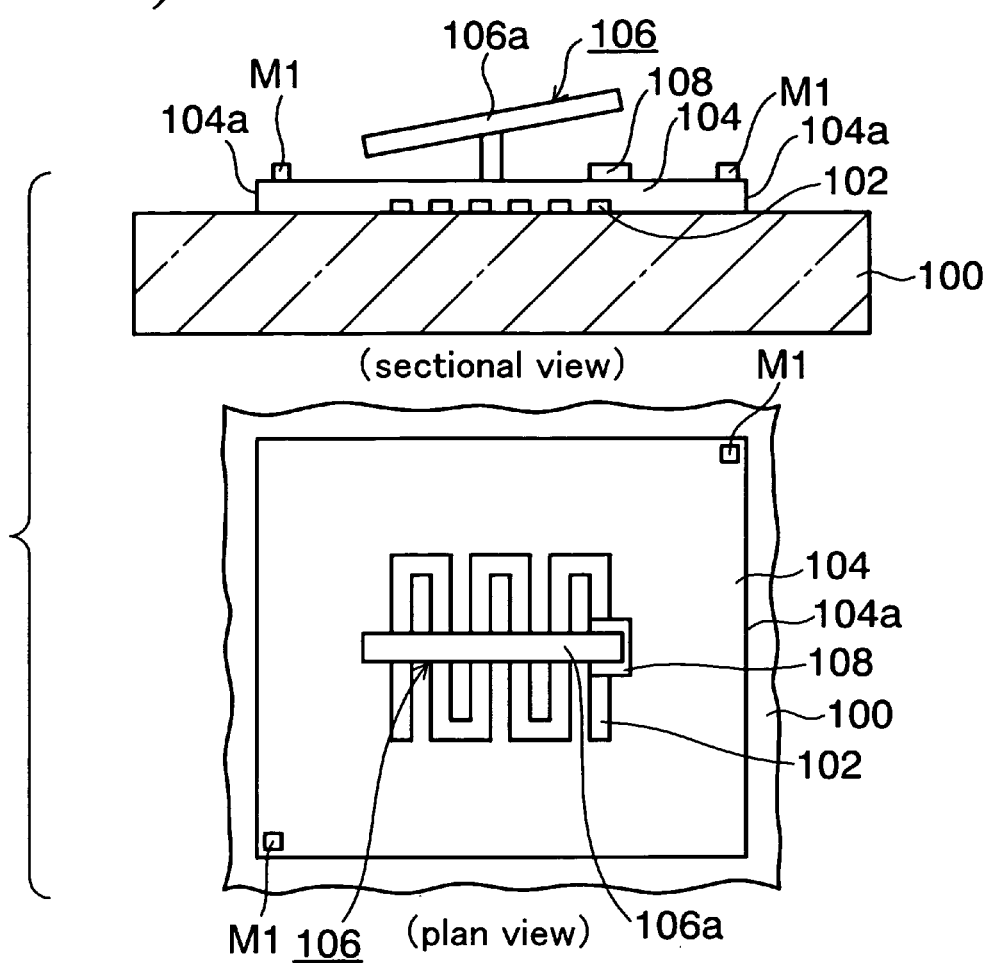
FIG. 1 is a view showing a MEMS element forming substrate in the prior art.
Figure 2:
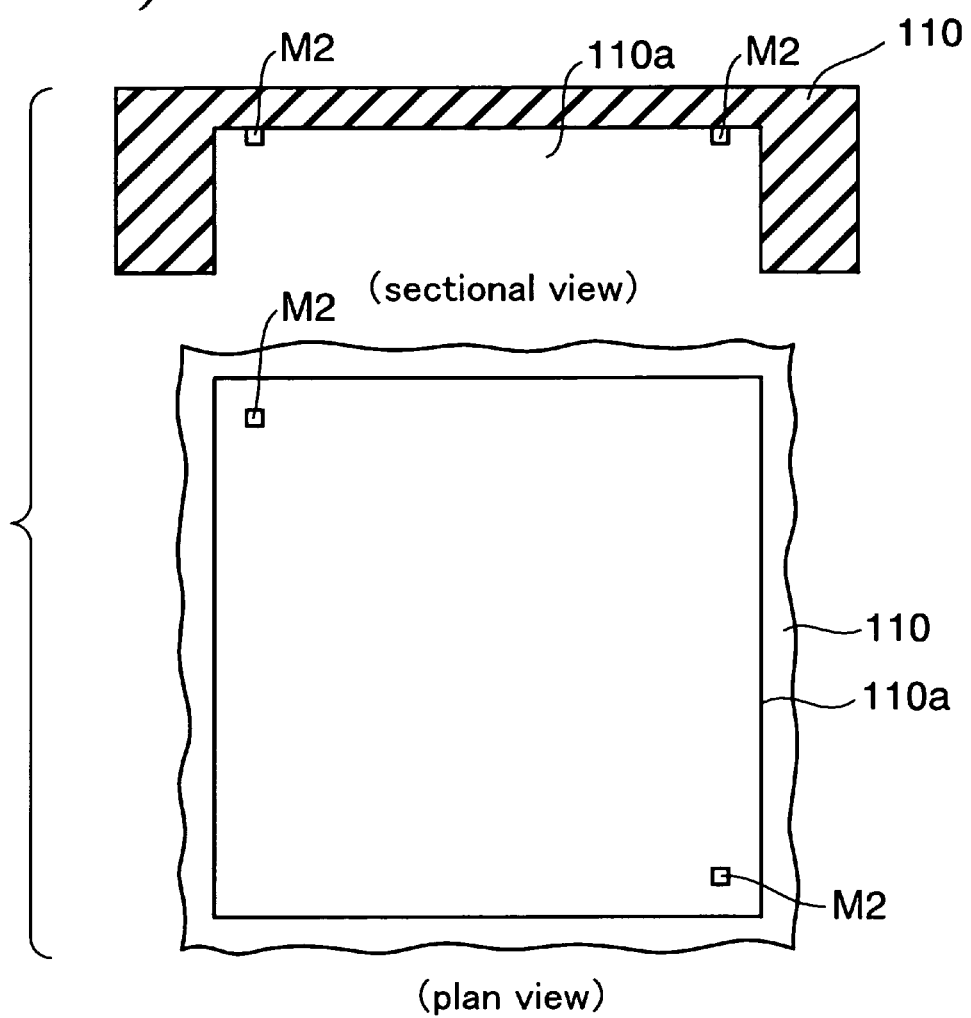
FIG. 2 is a view showing a sealing cap in the prior art.
Figure 3:
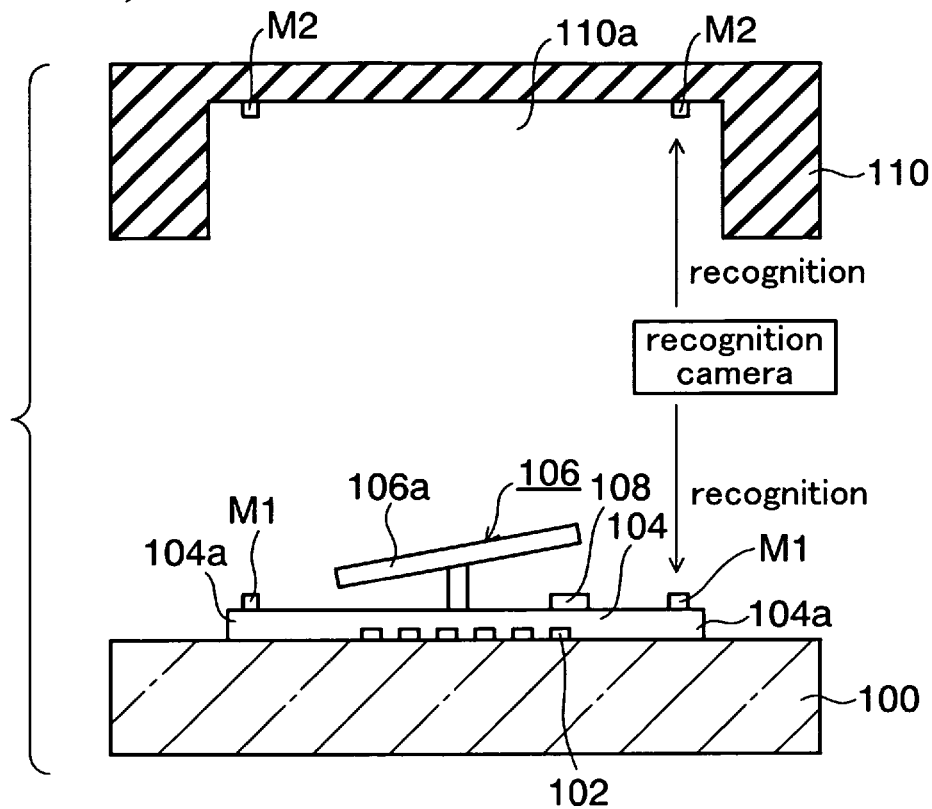
FIG. 3 is a sectional view (# 1) showing a state where the sealing cap is disposed on the MEMS element forming substrate in the prior art.
Figure 4:
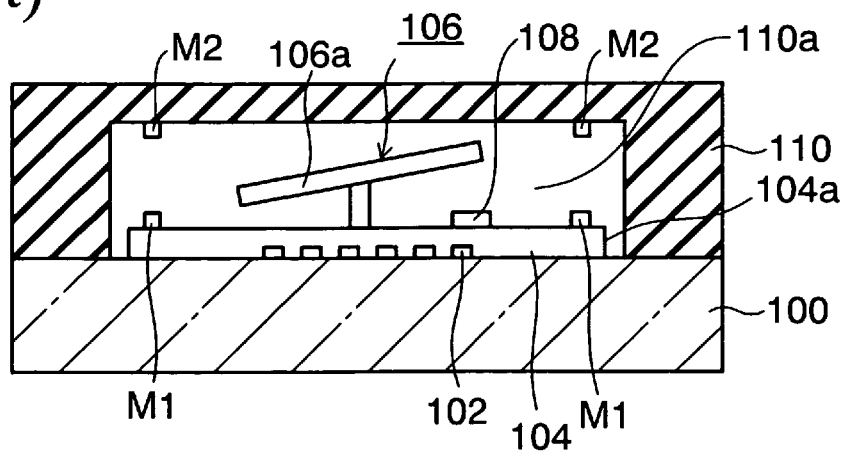
FIG. 4 is a sectional view (# 2) showing the state where the sealing cap is disposed on the MEMS element forming substrate in the prior art.
Figure 5A:
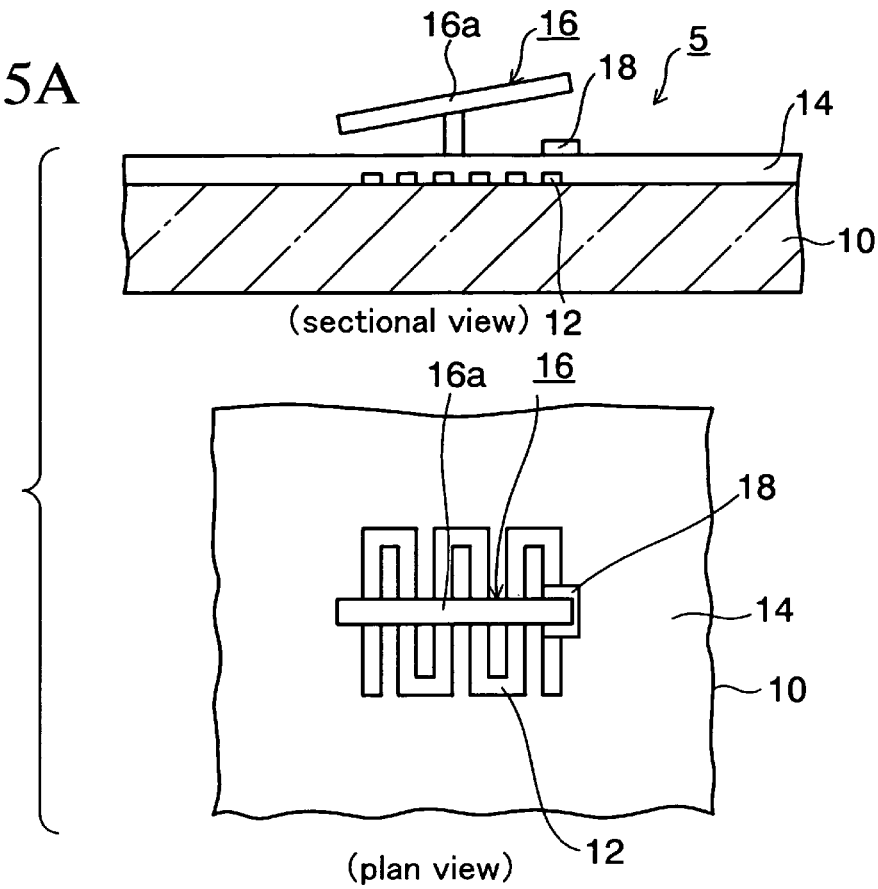
FIGS. 5A to 5H are sectional views (including a plan view) showing a method of manufacturing an electronic parts packaging structure (MEMS element device) according to a first embodiment of the present invention.
Figure 6:
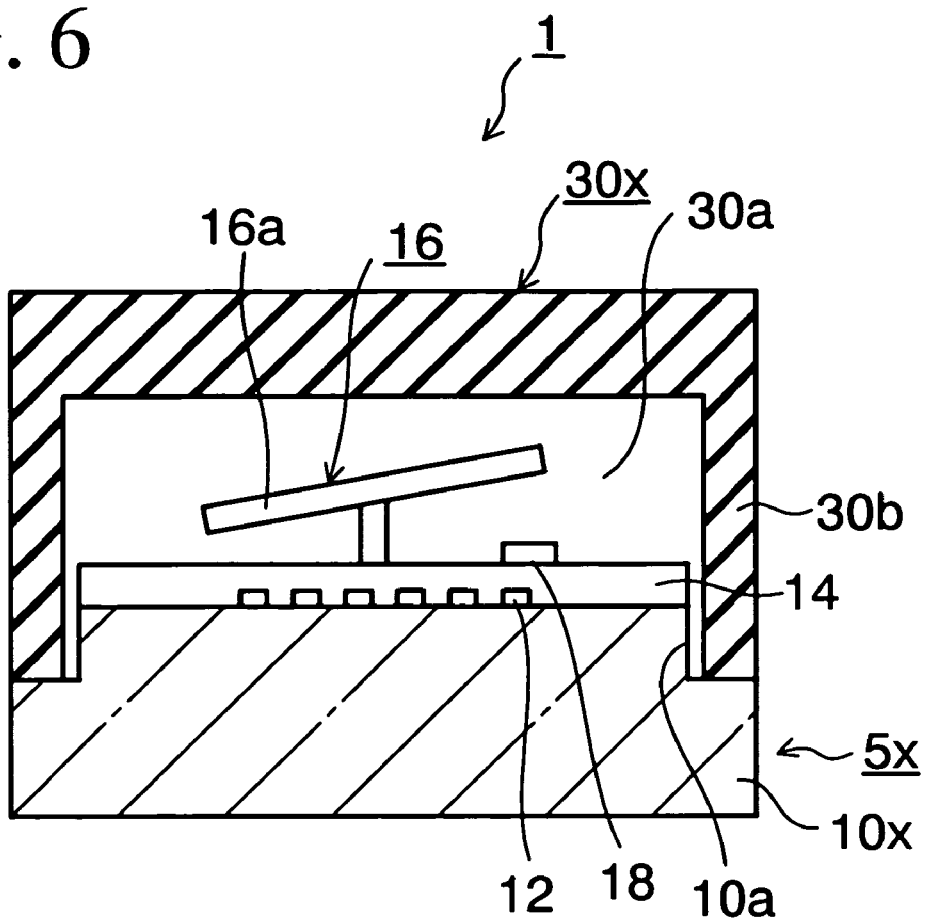
FIG. 6 is a sectional view showing the electronic parts packaging structure (MEMS element device) according to the first embodiment of the present invention.

First, a MEMS element forming substrate 5 as shown in FIG. 5A is prepared. In the MEMS element forming substrate 5, a planar coil 12 is formed on a silicon wafer 10, and a protective layer 14 which covers the coil 12 is formed. As the protective layer 14, a silicon nitride layer, a polyimide resin layer or the like with a thickness of 2 to 3 µm is used. Moreover, as a MEMS element, a switch element 16 having a movable portion (cantilever) 16a with a supporting point is formed on the protective layer 14. Furthermore, an electrode 18 is provided at a portion on the protective layer 14 corresponding to one end of the movable portion 16a of the switch element 16.

A drive energy is supplied to the movable portion 16a made of a magnetic alloy by an action of the planar coil 12. Accordingly, when the movable portion 16a is tilted and comes into contact with the electrode 18, it is a mechanism that a switch circuit is turned on. When a permanent magnet (not shown) for bias, which is provided in a lower side, catches the one end of the movable portion 16a, the ON state can be maintained.

Such switch element 16 as described above is provided in each of a plurality of element formation regions defined with a lattice-shape on the silicon wafer 10.

Note that, as the MEMS element forming substrate 5, a wafer on which an acceleration sensor, a DMD (digital mirror device) or the like besides the switch element 16 is formed may be used. Alternatively, instead of the MEMS element forming substrate 5, a silicon wafer on which an imaging device (an image sensor such as a CCD and a CMOS sensor) or an optical semiconductor element such as a semiconductor laser element and a photo detector is formed may be used.

Figure 5B:
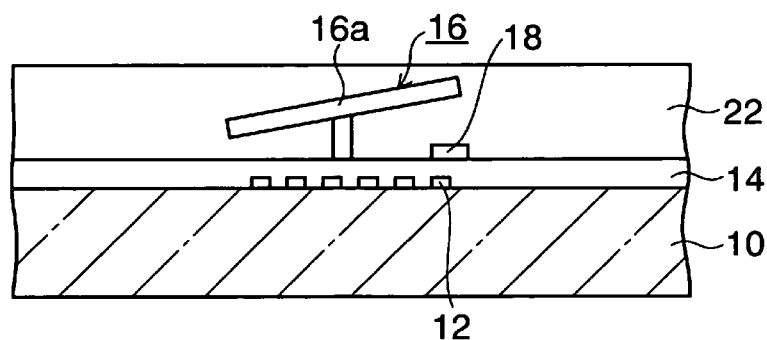
Figure 5C:
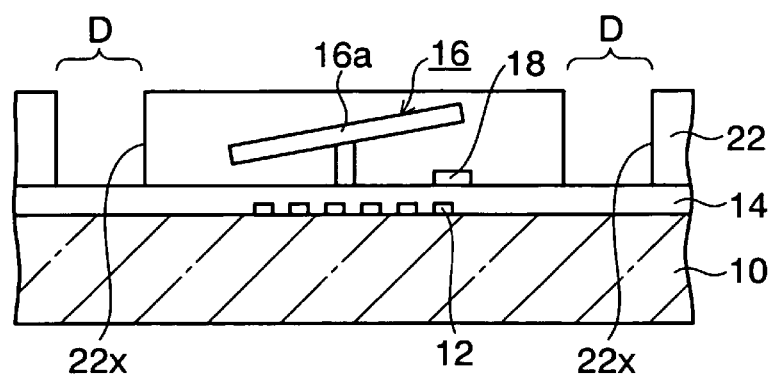
Figure 5D:
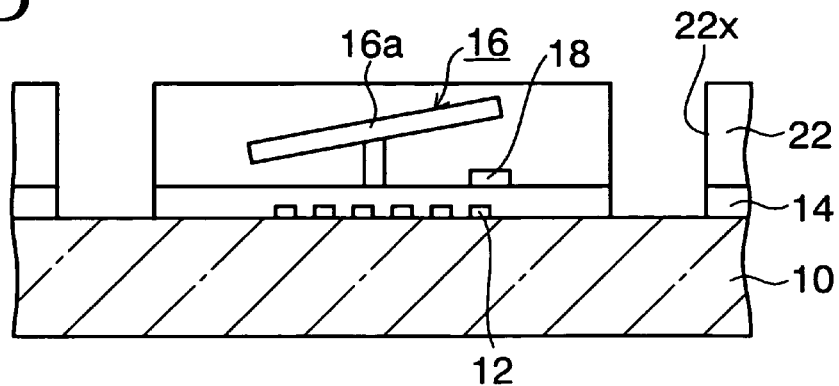

Next, as shown in FIG. 5B, a resist film 22 which covers the switch element 16 is formed. Furthermore, as shown in FIG. 5C, the resist film 22 is exposed and developed by photolithography. Thus, openings 22x are formed in portions of the resist film 22 corresponding to dicing regions D that become boundary parts of the plurality of element formation regions. Subsequently, as shown in FIG. 5D, the protective layer 14 exposed in the openings 22x is etched and removed by using the resist film 22 as a mask.

Figure 5E:
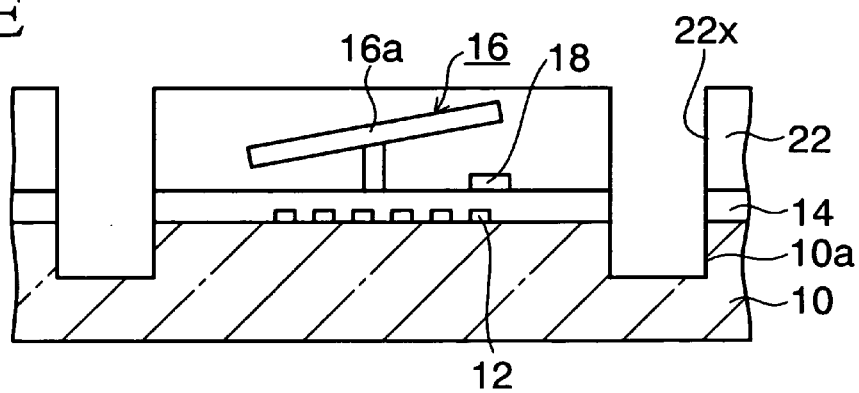

Furthermore, as shown in FIG. 5E, portions of the silicon wafer 10 exposed in the openings 22x of the resist film 22 are etched to form concave portions 10a. As etching of the silicon wafer 10, dry etching (such as RIE) or wet etching is employed. Thereafter, as shown in FIG. 5F, the resist film 22 is removed.

Figure 5F:
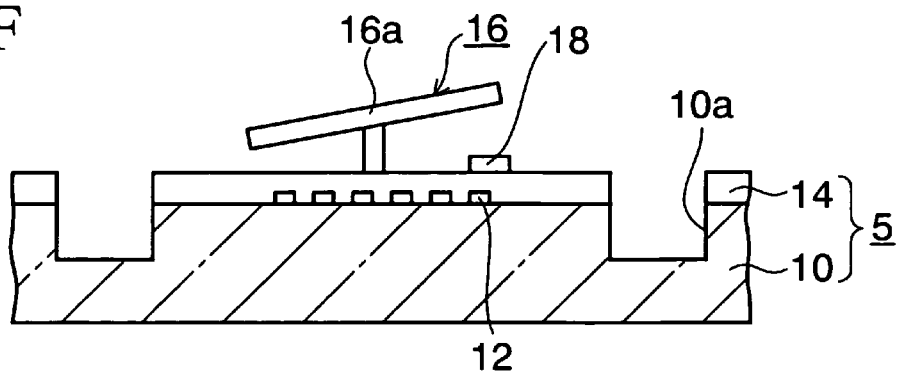
Figure 7:
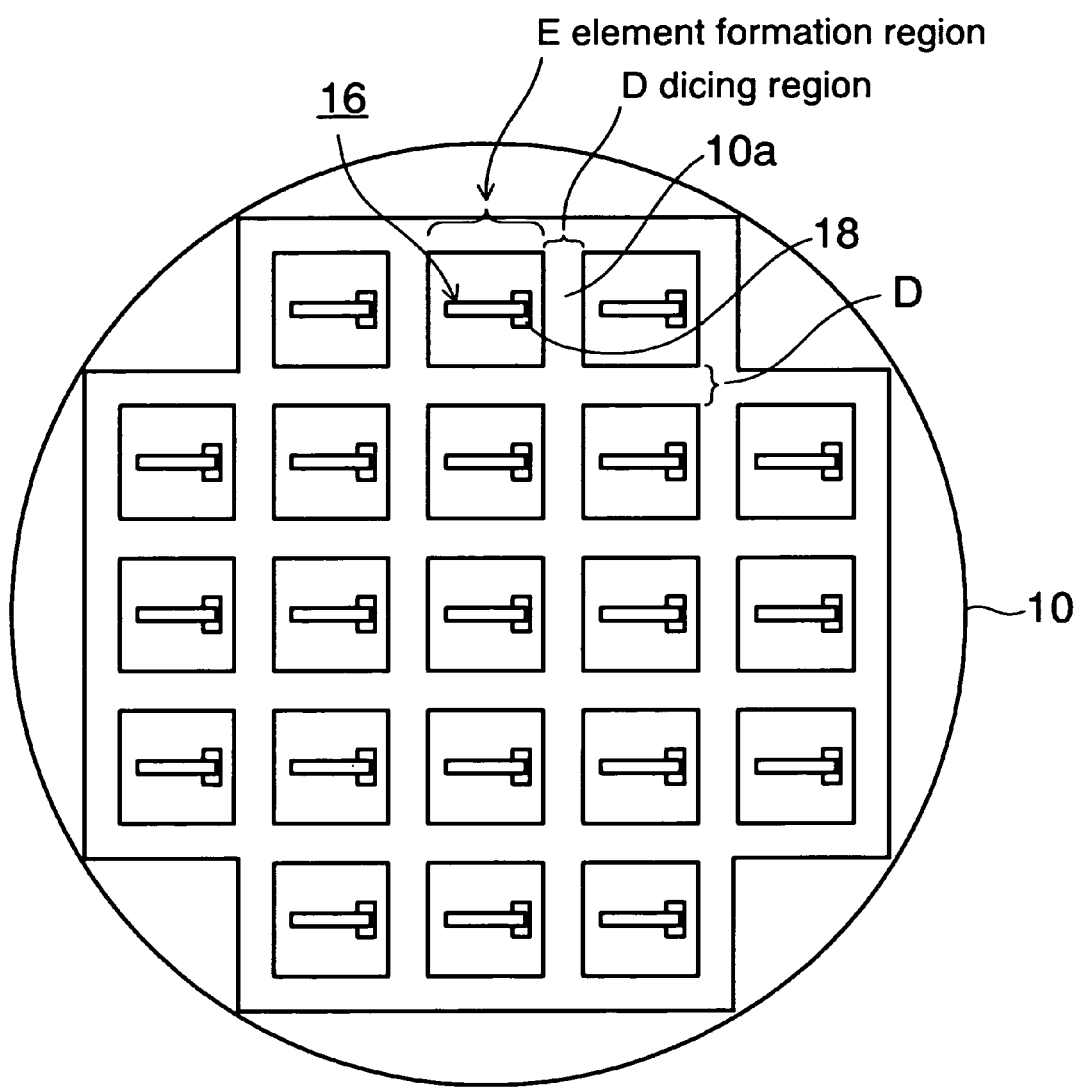
FIG. 7 is a plan view showing a state where a concave portion is formed in a MEMS element forming substrate according to the first embodiment of the present invention.

In FIG. 7, a state that the entire MEMS element forming substrate 5 is viewed from a planar direction after the step of FIG. 5F is drawn. As shown in FIG. 7, the concave portions 10a of the silicon wafer 10 are formed in a state of being connected with a lattice-shape in the dicing regions D so as to surround a plurality of element formation regions E in each of which the switch element 16 is provided. A width of the concave portions 10a is, for example, about 1 mm, and a depth thereof is, for example, about 30 to 50 µm.

Figure 5G:
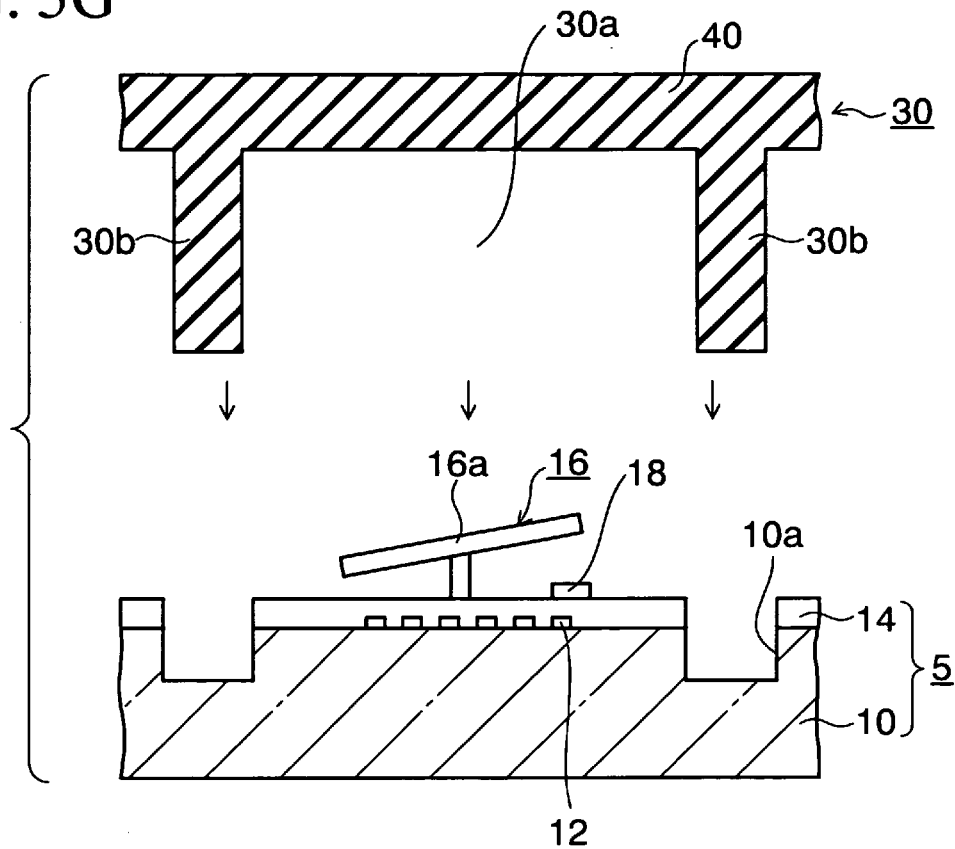
Figure 8:
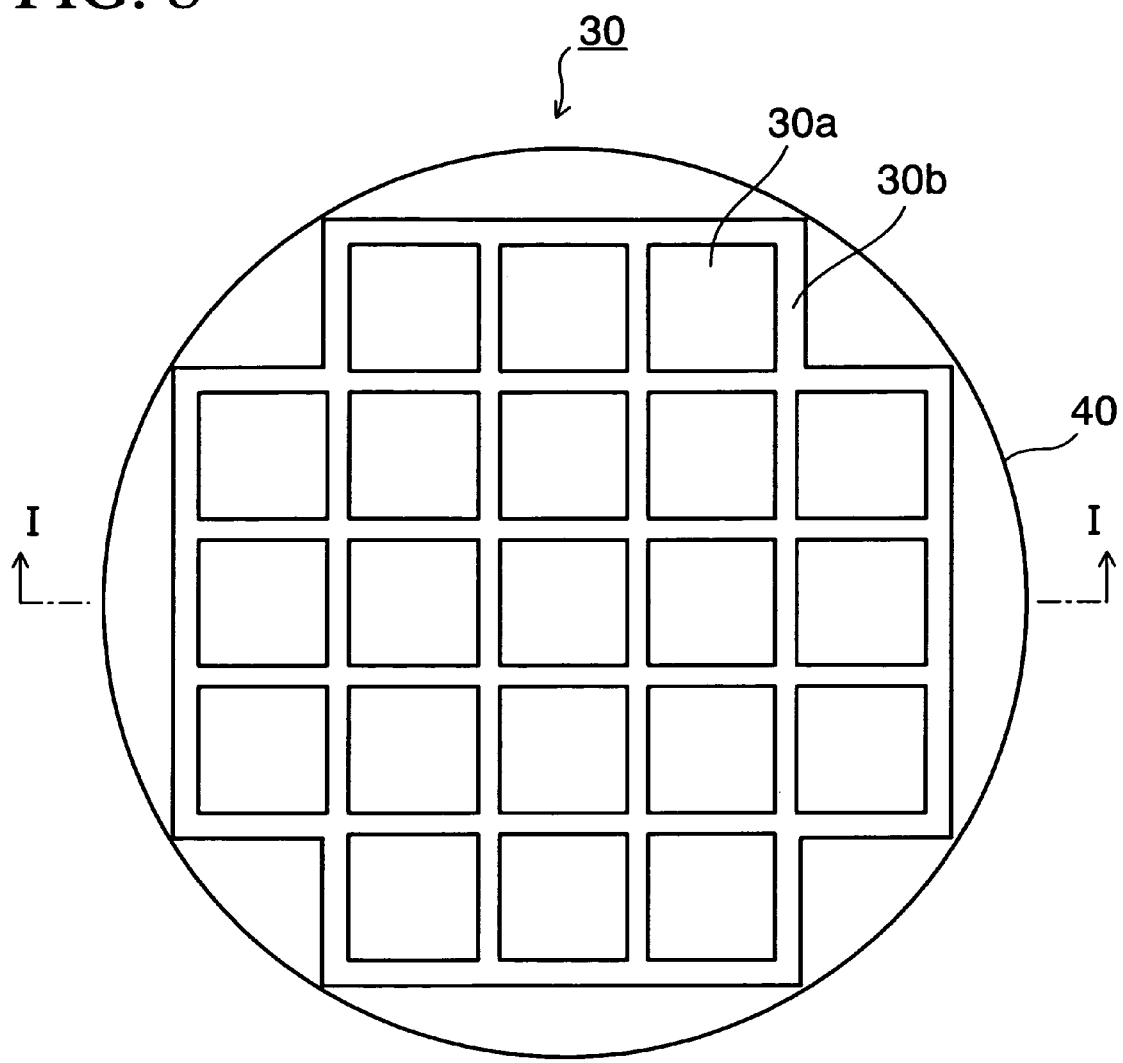
FIG. 8 is a plan view showing a state of a sealing cap substrate according to the first embodiment of the present invention.

Next, as shown in FIG. 5G, a glass integrated sealing cap substrate 30 is prepared, which has a structure in which ring-shaped protruded bonding portions 30b are formed on a glass wafer 40 (on a lower surface thereof in FIG. 5G) and a cavity 30a is provided by the protruded bonding portions 30b. In FIG. 8, a state that the entire sealing cap substrate 30 shown in FIG. 5G is viewed from a planar direction is drawn. The sealing cap substrate 30 of FIG. 5G shows a state of one of the cavities 30a in the cross section along the line I-I in FIG. 8. As shown in FIG. 8, in the sealing cap substrate 30, the protruded bonding portions 30b which are disposed to be connected with a lattice-shape on the glass wafer 40 are formed and the plurality of cavities 30a are formed by the protruded bonding portions 30b. The protruded bonding portions 30b of the sealing cap substrate 30 are provided in parts corresponding to the concave portions 10a (the dicing regions D in FIG. 7) of the MEMS element forming substrate 5 described above. Moreover, the cavities 30a are provided in parts corresponding to the element formation regions E (FIG. 7) of the MEMS element forming substrate 5.

The cavity 30a and the protruded bonding portions 30b in the sealing cap substrate 30 are formed in the following manner. Specifically, a resist film having required openings is formed on the glass wafer, and portions of the glass wafer exposed in the openings are processed by use of a sand blast method. Alternatively, the sealing cap substrate 30 having the same structure may be prepared by pouring melted glass into a required mold.

Figure 5H:
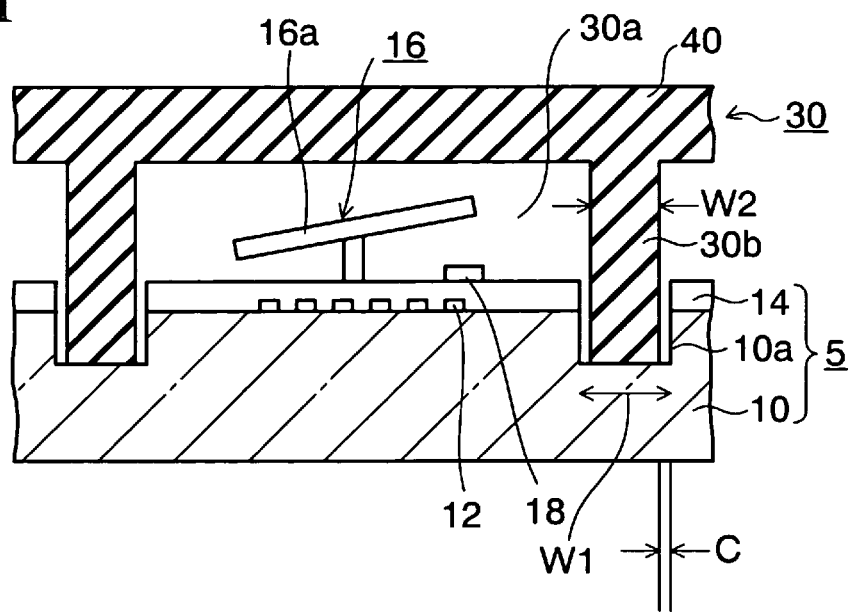

Thereafter, as shown in FIGS. 5G and 5H similarly, the lattice-shaped protruded bonding portions 30b of the sealing cap substrate 30 are fitted into the lattice-shaped concave portions 10a of the MEMS element forming substrate 5 described above. Specifically, the concave portions 10a of the MEMS element forming substrate 5 shown in FIG. 7 and the protruded bonding portions 30b of the sealing cap substrate 30 shown in FIG. 8 are disposed so as to face each other, and the protruded bonding portions 30b are fitted into the concave portions 10a.

In this event, an advanced alignment technology is not required. The protruded bonding portions 30b of the sealing cap substrate 30 and the concave portions 10a of the MEMS element forming substrate 5 are disposed by approximately positioning the both such that the protruded bonding portions 30b correspond to the concave portions 10a. Thereafter, by slightly moving the sealing cap substrate 30 to the left, right, upward or downward or by fine adjusting a disposition angle, the protruded bonding portions 30b of the sealing cap substrate 30 can be easily fitted into the concave portions 10a of the MEMS element forming substrate 5.

Moreover, at the same time, the protruded bonding portions 30b of the sealing cap substrate 30 are bonded to bottoms of the concave portions 10a of the MEMS element forming substrate 5 by anodic bonding. As conditions of the anodic bonding, for example, in a state where the MEMS element forming substrate 5 and the sealing cap substrate 30 are heated to 300 to 400° C., a voltage of 500 V to 1 KV is applied between the both. Accordingly, a large electrostatic attraction is generated between the MEMS element forming substrate 5 (silicon) and the sealing cap substrate 30 (glass). Thus, by chemical bonding on an interface therebetween, the protruded bonding portions 30b of the sealing cap substrate 30 are bonded to the concave portions 10a of the MEMS element forming substrate 5. Moreover, the anodic bonding is performed in a vacuum atmosphere. In a state where the cavity 30a of the sealing cap substrate 30 is set in a vacuum state, the switch element 16 is housed and hermetically sealed in the cavity 30a of the sealing cap substrate 30. Note that, in the case where an electronic parts which does not have to be operated in the vacuum atmosphere is used, the cavity 30a may be set in an air atmosphere.

Moreover, when the protruded bonding portions 30b of the sealing cap substrate 30 are disposed in a center part of the concave portions 10a of the MEMS element forming substrate 5 (when there is no positional shift), it is preferable that each of clearances (space) C (FIG. 5H) of about 10 to 20 µm can be secured between a side face of the protruded bonding portions 30b of the sealing cap substrate 30 and a side face of the concave portions 10a of the MEMS element forming substrate 5. Therefore, a width W2 (FIG. 5H) of the protruded bonding portions 30b of the sealing cap substrate 30 is set so as to be narrower than a width W1 (FIG. 5H) of the concave portions 10a of the MEMS element forming substrate 5 by about 20 to 40 µm.

Thereafter, as shown in FIG. 6, the sealing cap substrate 30 and the MEMS element forming substrate 5 are cut at the dicing regions D in the MEMS element forming substrate 5. Thus, individual MEMS element devices 1 are obtained.

In the MEMS element device 1 of the first embodiment, concave portions 10a are provided in a periphery part of a silicon substrate 10x of a chip-shaped MEMS element forming substrate 5x. Moreover, a tip part of protruded bonding portions 30b (glass) of a chip-shaped sealing cap 30x is anodic-bonded to bottoms of the concave portions 10a. Accordingly, the switch element 16 is housed and hermetically sealed in a cavity 30a of the sealing cap 30x.

Note that, after the MEMS element forming substrate 5 having the concave portions 10a formed therein is diced to obtain a chip-shaped MEMS element forming substrate, a chip-shaped sealing cap corresponding thereto may be bonded by use of the same method. Alternatively, concave portions are formed in a chip-shaped MEMS element forming substrate 5 and a chip-shaped sealing cap may be bonded thereto by use of the same method.

As described above, in this embodiment, the concave portions 10a of the MEMS element forming substrate 5 are set to function as a groove for alignment at a time of disposing the sealing cap substrate 30. Thus, unlike the prior art, an expensive alignment mechanism based on complicated camera image recognition is not required. Only by forming the concave portions 10a in the MEMS element forming substrate 5, the sealing cap substrate 30 can be positioned in a self-aligning manner and bonded. Thus, manufacturing costs can be significantly reduced. Moreover, it is not required to form alignment marks on the MEMS element forming substrate 5 or the sealing cap substrate 30. From this viewpoint, also the manufacturing costs can be reduced.

Second Embodiment

Figure 9A:
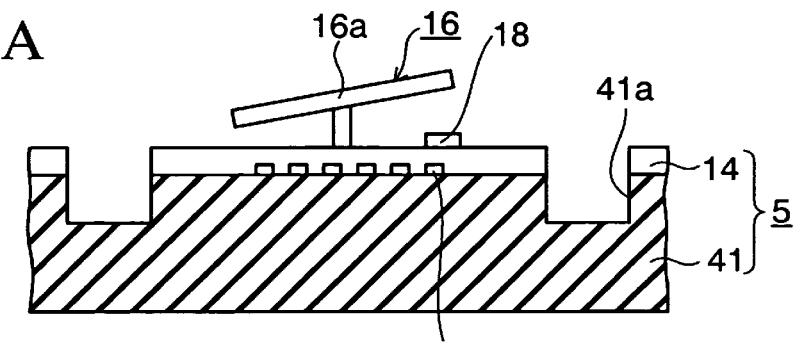
FIGS. 9A to 9C are sectional views showing a method of manufacturing an electronic parts packaging structure (MEMS element device) according to a second embodiment of the present invention.
Figure 9B:
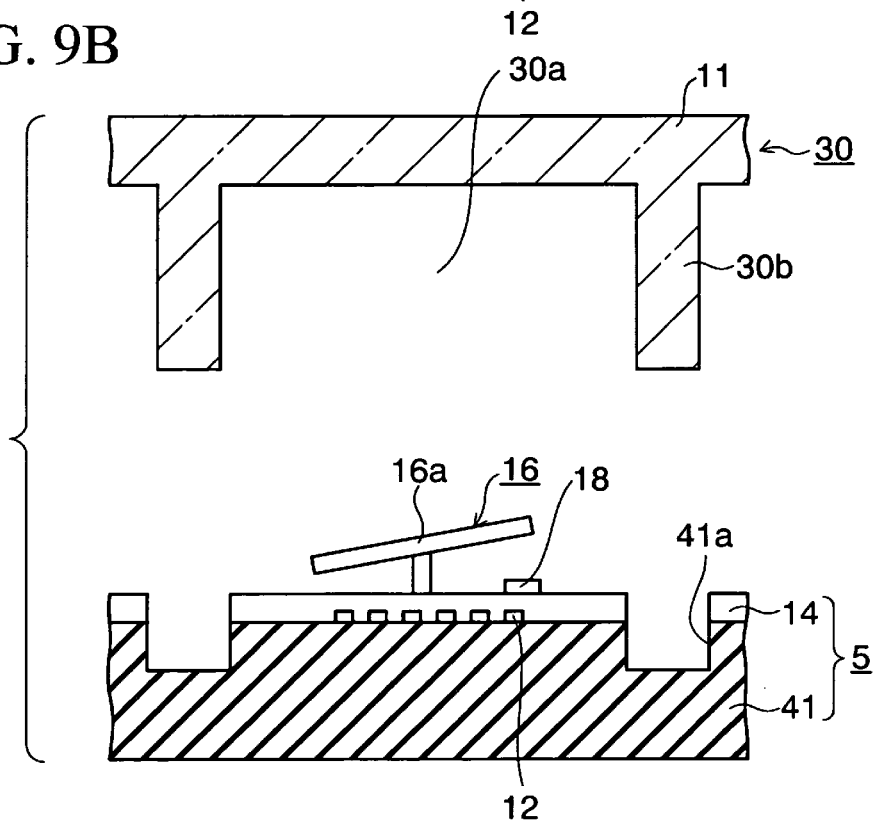
Figure 9C:
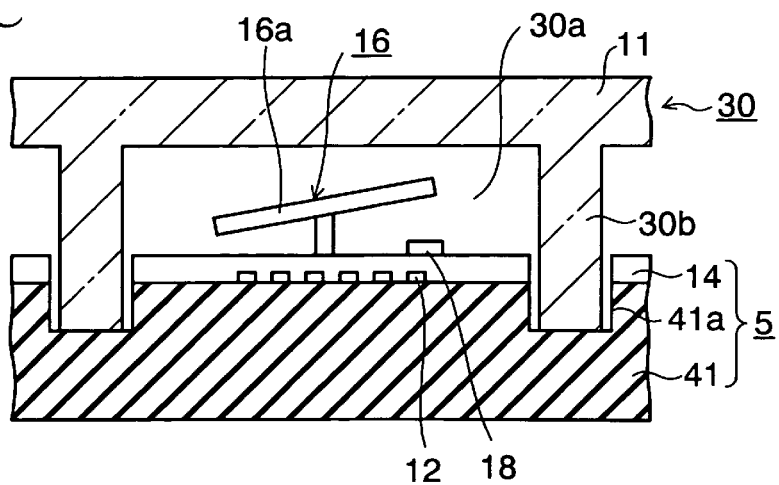
Figure 10:
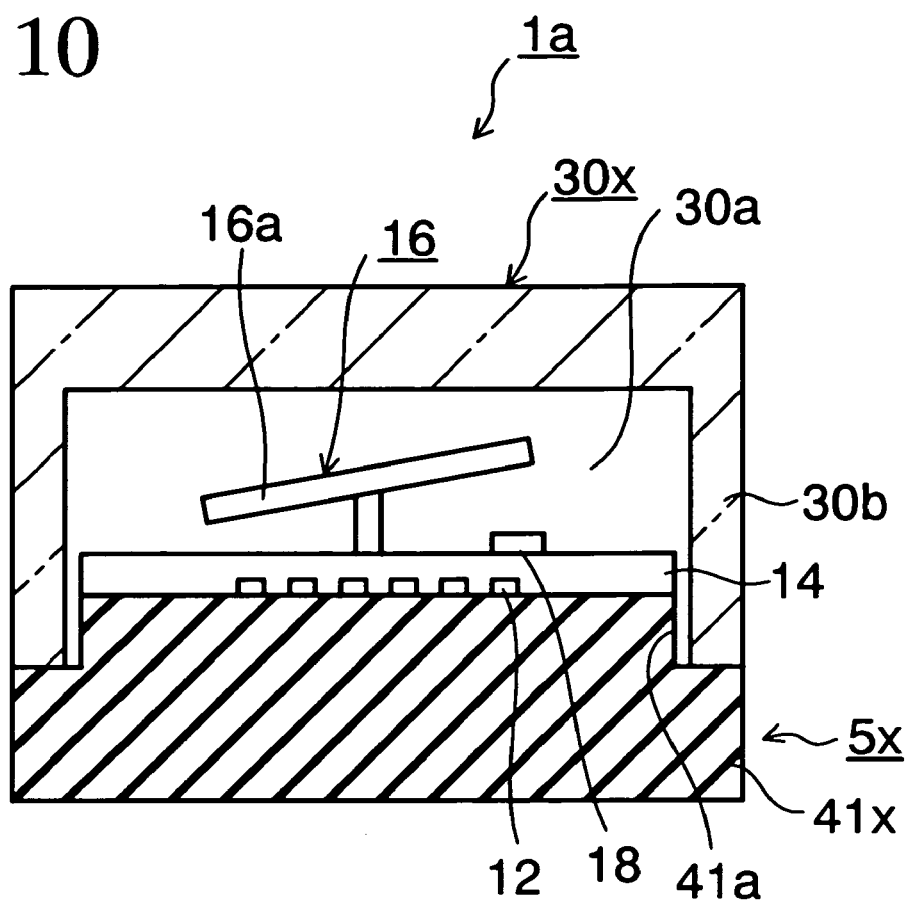
FIG. 10 is a sectional view showing the electronic parts packaging structure (MEMS element device) according to the second embodiment of the present invention.

FIGS. 9A to 9C are sectional views showing a method of manufacturing an electronic parts packaging structure according to a second embodiment of the present invention. FIG. 10 is a sectional view also showing the electronic parts packaging structure. In the second embodiment, contrary to the first embodiment, a glass wafer is used as a MEMS element forming substrate, and a silicon wafer is used as a sealing cap substrate. In the second embodiment, detailed descriptions of the same steps as those in the first embodiment will be omitted.

In the second embodiment, as shown in FIG. 9A, in the steps of FIGS. 5D to 5F in the first embodiment, a glass wafer 41 is used instead of the silicon wafer 10 as a MEMS element forming substrate 5, and concave portions 41a are formed in the glass wafer 41. The concave portions 41a in the glass wafer 41 are formed in the following manner. Specifically, a resist film having required openings provided therein is formed on the glass wafer, and portions of the glass wafer in the openings are processed by use of a sand blast method, thereby the concave portions 41a are formed in the glass wafer 41.

Next, as shown in FIG. 9B, a silicon integrated sealing cap substrate 30 is prepared, in which protruded bonding portions 30b are formed on a silicon wafer 11 (on a lower surface thereof in FIG. 9B) and a cavity 30a is provided. The cavity 30a and the protruded bonding portions 30b of the sealing cap substrate 30 in the second embodiment are formed in the following manner. Specifically, a resist film having required openings is formed on the silicon wafer, and portions of the silicon wafer in the openings are etched by RIE or the like.

Thereafter, as shown in FIGS. 9B and 9C, by use of the same method as that of the first embodiment, the protruded bonding portions 30b (silicon) of the sealing cap substrate 30 are positioned in a self-aligning manner and fitted into the concave portions 41a of the MEMS element forming substrate 5 (glass). At the same time, the protruded bonding portions 30b and the concave portions 41a are bonded to each other by anodic bonding. Thereafter, as shown in FIG. 10, the sealing cap substrate 30 and the MEMS element forming substrate 5 are cut at dicing regions to obtain individual MEMS element devices 1a.

In the MEMS element device 1a in the second embodiment, concave portions 41a are provided in a periphery part of a glass substrate 41x of a chip-shaped MEMS element forming substrate 5x. Moreover, a tip part of protruded bonding portions 30b (silicon) of a chip-shaped sealing cap 30x is anodic-bonded to bottoms of the concave portions 41a. Accordingly, a switch element 16 is housed and hermetically sealed in a cavity 30a of the sealing cap 30x.

The same effects as those of the first embodiment are also achieved in the second embodiment.

What is claimed is:

1. An electronic parts packaging structure comprising:
   an electronic parts forming substrate having a flat plate-like shape in which an electronic parts is formed in a formation region and a concave portion is provided in a periphery part of the formation region, the concave portion being formed by etching the substrate, the concave portion having a step shape, no outer side surface of which exists; and
   a sealing cap in which a ring-shaped protruded bonding portion which constitutes an outermost side portion is formed and a cavity is provided by the protruded bonding portion, and the protruded bonding portion is fitted into and bonded to the concave portion in the electronic parts forming substrate such that an air gap exists between said sealing cap and said electronic parts such that said sealing cap does not contact said electronic parts, and such that a clearance exists between an inner side surface of the concave portion and the protruded bonding portion;
   wherein the electronic parts is hermetically sealed in the cavity of the sealing cap.

2. The electronic parts packaging structure according to claim 1, wherein the electronic parts forming substrate and the sealing cap are composed of a combination of material in which one is made of silicon and the other is made of glass, and the protruded bonding portion of the sealing cap is bonded to the concave portion of the electronic parts forming substrate by anodic bonding.

3. The electronic parts packaging structure according to claim 1, wherein the electronic parts is any one selected from a group consisting of an MEMS element, an image sensor and an optical semiconductor element.

4. A method of manufacturing an electronic parts packaging structure comprising the steps of:
   preparing an electronic parts forming substrate having a flat plate-like shape in which an electronic parts is formed in a formation region and a concave portion is provided in a periphery part of the formation region, the concave portion being formed by etching the substrate, and a height of both side surfaces of the concave portion is identical, and the concave portion both side surfaces of which are formed of an identical surface, respectively, and a sealing cap in which a ring-shaped protruded bonding portion which constitutes an outermost side portion is formed at a portion corresponding to the concave portion in the electronic parts forming substrate and a cavity is provided in a portion corresponding to the formation region; and
   hermetically sealing the electronic parts in the cavity of the sealing cap by aligning and bonding the protruded bonding portion of the sealing cap into the concave portion of the electronic parts forming substrate by means of fitting the protruded bonding portions into the concave portion such that an air gap exists between said sealing cap and said electronic parts such that said sealing cap does not contact said electronic parts, and such that a clearance exists between both side surfaces of the concave portion and the protruded bonding portion.

5. The method of manufacturing an electronic parts packaging structure, according to claim 4, wherein,
   the electronic parts forming substrate is a substrate in which a plurality of the formation regions and the concave portions are provided, the concave portions being formed with a lattice-shape so as to surround the plurality of formation regions, and
   the sealing cap is a sealing cap substrate in which a plurality of the cavities and the protruded bonding portions are provided, the protruded bonding portions being formed with a lattice-shape so as to surround said plurality of cavities,
   comprising the additional step of:
   obtaining individual chip-shaped electronic parts packaging structures by cutting the sealing cap substrate and the electronic parts forming substrate, after the step of hermetically sealing the electronic parts.

6. The method of manufacturing an electronic parts packaging structure, according to claim 4, wherein the electronic parts forming substrate and the sealing cap are composed of a combination of material in which one is made of silicon and the other is made of glass, and the protruded bonding portion of the sealing cap is bonded to the concave portion of the electronic parts forming substrate by anodic bonding.

7. The method of manufacturing an electronic parts packaging structure, according to claim 4, wherein the electronic parts is any one selected from a group consisting of a MEMS element, an image sensor and an optical semiconductor element.

8. The method of manufacturing an electronic parts packaging structure, according to claim 4, wherein a depth of the concave portion of the electronic parts forming substrate is 30 to 50 μm, and a width of the protruded bonding portion of the sealing cap is set so as to be narrower than a width of the concave portion of the electronic parts forming substrate by 20 to 40 μm.

* * * * *